Figure 5:
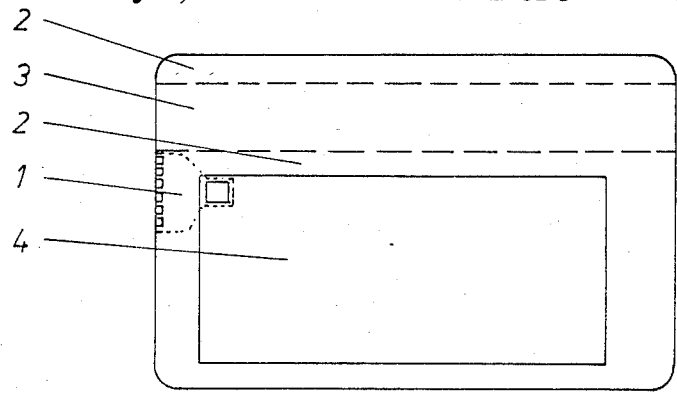

United States Patent [19]

Hoppe et al.

[11] Patent Number: 4,587,413

[45] Date of Patent: May 6, 1986

[54] IC-MODULE IDENTIFICATION CARD

[75] Inventors: Joachim Hoppe; Yahya Haghiri-Tehrani, both of Munich, Fed. Rep. of Germany

[73] Assignee: GAO Gesellschaft fur Automation und Organisation mbH, Fed. Rep. of Germany

[21] Appl. No.: 773,417

[22] Filed: Sep. 6, 1985

Related U.S. Application Data

[63] Continuation of Ser. No. 637,683, Aug. 2, 1984, Pat. No. 4,550,248, which is a continuation of Ser. No. 356,800, Mar. 10, 1982, abandoned.

[30] Foreign Application Priority Data

Mar. 24, 1981 [DE] Fed. Rep. of Germany ....... 3111516
Mar. 24, 1981 [DE] Fed. Rep. of Germany ... 8108609[U]

[51] Int. Cl.4 .................................................. G06K 19/06
[52] U.S. Cl. ...................................... 235/492; 283/904; 283/83; 235/382
[58] Field of Search ............... 235/380, 382, 492, 493, 235/487, 489, 488; 340/825.33; 283/83, 904

[56] References Cited

U.S. PATENT DOCUMENTS 4,380,699  4/1983  Monnier et al. ..................... 235/492
4,501,960  2/1985  Jouvet et al. ....................... 235/492

Primary Examiner—Gene Z. Rubinson
Assistant Examiner—Robert G. Lev
Attorney, Agent, or Firm—Andrus, Sceales, Starke & Sawall

[57] ABSTRACT

An identification card having an IC module for the processing of electrical signals. The IC module (9) and the leads (6) and contact surfaces (5, 20) necessary for the operation of the module are attached to a separate carrier (7, 17) and embedded in the identification card in such a way that the IC module is located in an area (4) of the card having the maximally permitted thickness, whereas the contact surfaces are arranged outside this area. The placement of the IC module in the elevated card area (e.g. the impressing area) allows for a thicker encapsulation of the module and correspondingly better protection against mechanical stress. On the other hand, the area of the carrier element with the contact surfaces is arranged outside the elevated area of the card, for example in the magnetic stripe area (2). As the carrier element can be designed so as to be very thin in the area of the contact surfaces, its incorporation in the area of the magnetic stripe (3) of the card presents no problems of production whatsoever. This unproblematic incorporation of the thinly designed contact surface or lead area, which is arranged on the carrier element separated from the IC module, finally allows for a very variable design of the contact surfaces, as far as their dimensions and their position on the identification card are concerned.

12 Claims, 9 Drawing Figures

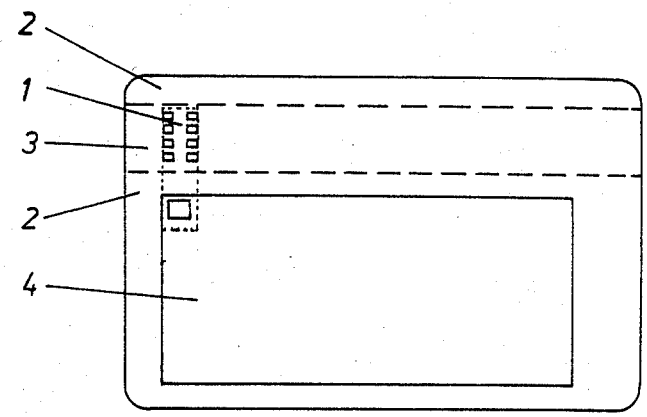
Fig. 1  Fig. 2
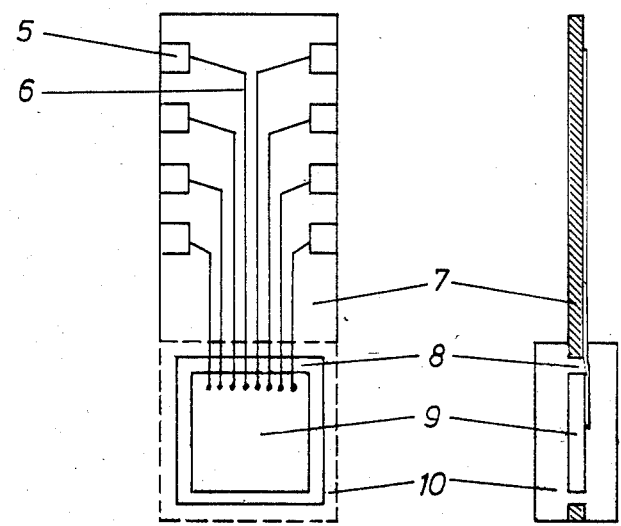
Fig. 3  Fig. 4

IC-MODULE IDENTIFICATION CARD

The present application is a continuation application of U.S. patent application Ser. No. 637,683 filed Aug. 2, 1984 and now U.S. Pat. No. 4,550,248. That application is a continuation application of U.S. patent application Ser. No. 356,800 of Mar. 10, 1982, now abandoned.

The invention relates to an identification card having an IC module for the processing of electrical signals, in which the IC module along with its contact surfaces is applied to a separate carrier and set into a window in the identification card. The invention further relates to a method of producing said card.

National as well as international norms exist for identification cards having an orthodox design, and these norms should be met as closely as possible by identification cards having integrated circuits as well.

Thus the magnetic stripe, for example, should be arranged in the upper area of the card on the back of the card. On both sides of the magnetic stripe safety zones should be provided, in which the normal card thickness of 0.76 mm should be kept to. In the rest of the lower card area, excluding the marginal zones of the card, raised areas of 0.48 mm are permissible, e.g. in the form of impressed data.

Identification cards having integrated circuits which take the requirements of the norm into consideration have already become known.

The German Application No. 26 59 573 discloses an identification card in which the IC module and contact surfaces are both arranged on a so-called carrier element.

In this construction the IC module is arranged on the carrier element so as to be unprotected, which demands corresponding efforts when integrating the IC module into the identification card. Due to the sensitivity of this carrier element it is difficult to handle it and it is not possible to laminate it directly into the identification card, for example.

The problem when incorporating IC modules into identification cards consists in the fact that the normal card thickness permitted by the norm restricts the mechanical protective measures for the IC module and its terminal leads, so that only constructions that are "thin" can be processed. It is therefore proposed in the German application No. 26 59 573 to arrange the carrier element and its contact surfaces completely within the so-called impressing area, in order to guarantee optimal protection for the IC module by exploiting the height permitted for elevated impressions.

The disadvantage of this measure proves to be that the area intended for impressions can only be used to a greatly reduced extent to take up impressed data according to the regulations. This means a considerable restriction on the application and further design of the card.

It has also been proposed (P No. 30 29 939.9) to arrange the carrier element outside the impressing area. In this way the reduction of the information surface for impressed data is in fact avoided, but only the space above the actual impressed part, i.e. the area of the magnetic stripe, in which the normal card thickness must be observed, remains for the placement of the IC module and its contact surfaces.

According to the norm, only very low tolerances are permitted in the surface structure of the magnetic stripe. Special laminating methods and/or particular steps in the layer construction of the card are necessary to fulfill these requirements.

The invention provides an identification card in which the above-mentioned disadvantages are avoided to a great extent without affecting the protection of the IC module.

This object is achieved according to the invention by arranging the IC module and its leads and contact surfaces on a carrier element processed as a self-contained unit and embedding them in the identification card in such a way that only the portion with the IC module is located in the card area provided for permissible raised areas, and the portion with the IC contacts is located outside this area.

The invention is based on the idea that the IC module and its terminals, in order to be optimally protected, should be located in the area having the maximal permissible thickness, since here the permitted height allows for thicker encapsulation of the module. On the other hand, this area should be retained as much as possible for its initial purpose, i.e. to take up information for impressed data, for example.

In an exemplary embodiment of the invention, the module protected from mechanical influences is arranged exclusively in the card area provided for permissible raised areas. The IC contacts, however, are provided, with contacting access on the front of the card, in the magnetic stripe area of the card, in particular outside the principal stress axes, i.e. in the area of the upper card edge.

As the portion with the contact surfaces can be designed so as to be very thin, its incorporation in the area of the magnetic stripe poses no problems of functional efficiency whatsoever. This incorporation which is free of problems relating to card technology finally also allows for the contact surfaces to be designed very variably, as far as their position and dimensions are concerned.

In the more recent embodiments of IC cards known there is a trend towards regarding the IC module and its contact elements as a compact unit and minimizing the space needed by reducing the dimension of the entire arrangement. The contact surfaces are therefore predetermined to a large extent as far as their position and dimensions are concerned.

As opposed to this practice, the IC module and the contact elements that go along with it are applied according to the invention to a carrier element whose form and dimensions are determined by a separation of the IC module, contact surfaces and lead area in any way that meets the practical requirements. This carrier element can also be produced as a prefabricated unit independently of the production of the card.

The component which is mainly in need of protection, the IC module, can be freely positioned independently of the contact surfaces, requiring minimal space, and even when provided with additional arrangements for mechanical protection. It can be positioned, for example, in the area permitted for additional raised areas, without influencing the areas which are actually provided to take up information as is usually the case when optimally protected thick IC modules are being processed. The magnetic stripe can be produced with excellent quality without any additional effort by means of the known methods of prior art.

Although the area provided for additional raised areas is defined very differently by the various norms, the design of the identification card according to the invention allows for the possibility of providing the contacts at any location on the identification card independently and taking the relevant norm into consideration. When possible, overriding norm concerning the contact arrangement is to be met, it is also possible to provide the contacts constantly at the same location on the identification card, taking the known productional advantages of carrier elements that can be used as semi-products into consideration.

Further features and advantages of the invention can be found in the drawings and explanations below.

FIG. 1 an identification card having a carrier element.

FIG. 2 an identification card in cross-section.

FIG. 3 a carrier element.

FIG. 4 a carrier element in cross-section.

FIG. 5 an identification card having a carrier element.

Figure 6:
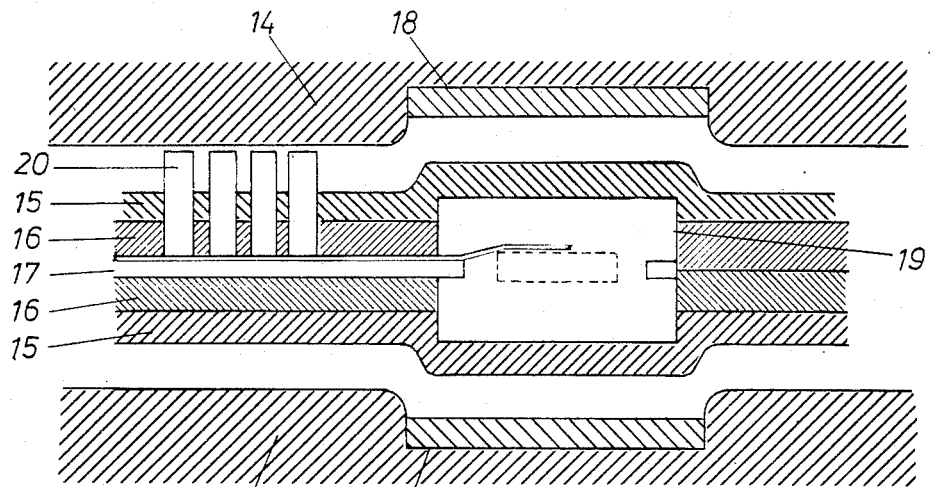

FIG. 6 a production device for identification cards.

Figure 7:
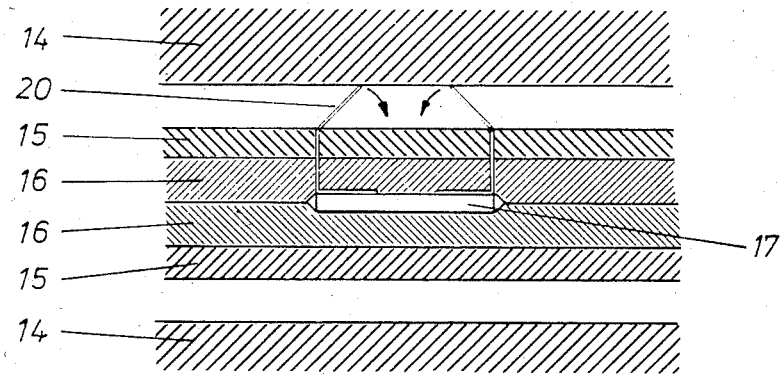

FIG. 7 a method of producing identification cards having contacts on the surface.

Figure 8:
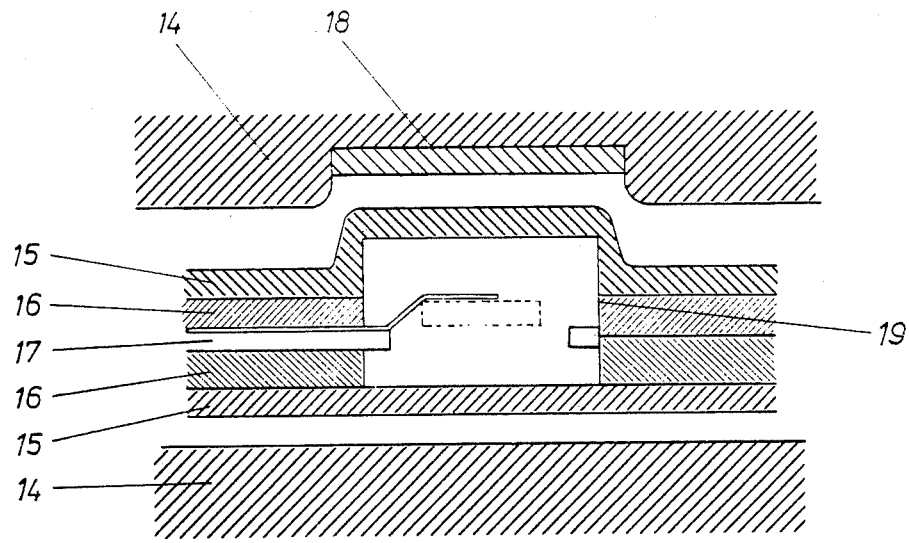

FIG. 8 a production device for identification cards.

Figure 9:
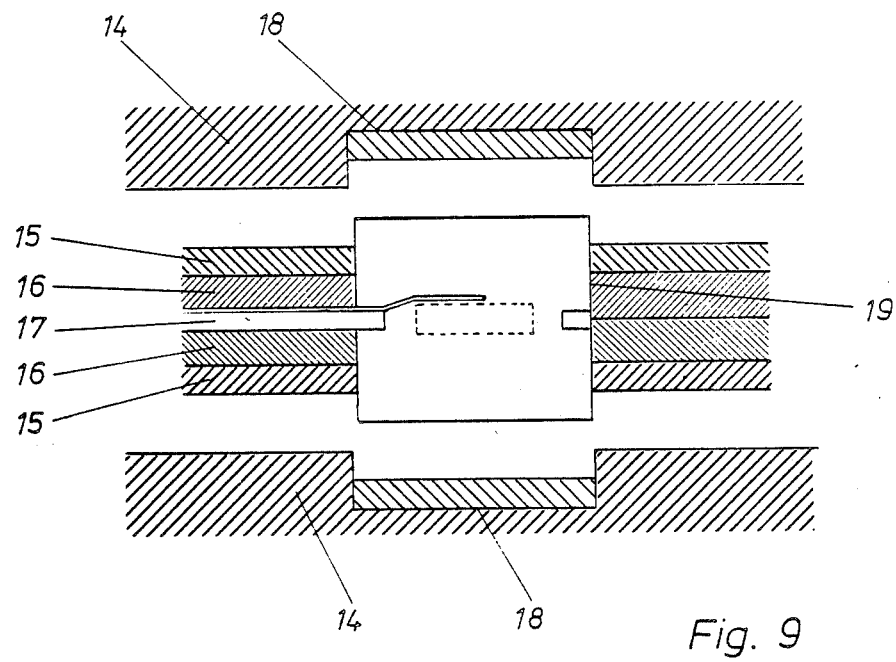

FIG. 9 a production device for identification cards.

FIG. 1 shows the possible construction of an identification card. In the upper area of the back of the card is the space reserved for the magnetic track 3, in which information can be stored and/or recalled in dynamic operation via read-write devices. Above and below the magnetic track 3 there are safety zones 2, which must not have any raised areas, in order to avoid possible complications during the read-write operation. In the lower half of the card is the surface 4 in which raised areas (e.g. to take up impressed data) are permitted. The raised areas may increase the normal card thickness of 0.76 mm by 0.48 mm. The cross-section of the card in FIG. 2 shows the normal standard thickness and the permitted height, for example, of impressed signs, by which the standard thickness may be increased.

Norms also exist for identification cards allowing for raised areas in certain areas on the front and back of the card, which is taken into consideration in the following example.

The possible form of a carrier element 1 having leads 6, contact surfaces 5 and IC module 9 is shown in FIG. 3. A conductive film is laminated onto a film carrier 7 and then leads 6 and contact surfaces 5 are etched out. The ends of the leads go into the window 8 provided for the IC module, in which window the latter is supported only by the outer leads when contacted. Then a cast 10 on the IC module 9 assures protection of the sensitive component and points of contact from mechanical stress and strain. The carrier film 7 employed is preferably made of a thermostable film having high tensile strength (e.g. polyester film).

FIG. 1 also shows a possible placement of the carrier element 1 in the identification card. The carrier element 1 is arranged in such a way that the cast IC module is located completely within the area 4 permitted for raised elements, requiring a minimum of space. The surface required for its incorporation is determined only by the size of the IC module and/or its encapsulation. This surface is negligeably small in relation to the entire surface of the area permitted for raised elements, so that practically the whole surface 4 is available for the rendition of information, e.g. in the form of impressed data. The contacts are led into the area having normal card thickness, e.g. into zone 3 where a magnetic track is provided on the back of the card. Access is had to the contacts from the front of the card, e.g. by direct contact with contact pins, of the contact surfaces are on the surface of the card. If, however, they are laminated in or are located beneath a protective layer, contact is made with thin pins which pierce the laminate or protective layer.

FIG. 5 shows another possible form of the carrier element 1, in which the contacts are led onto one side of the card, but the cast IC module is also located in the area 4 permitted for raised elements. To satisfy a particular practical need or fulfill a certain norm concerning the position of the areas permitted for raised elements (e.g. impressed areas) or the placement of contacts, the separation of protected, cast IC modules, leads and contact surfaces as well as the form of the carrier element can be adapted to various requirements without difficulty, so that the IC module is always located on a minimal surface in the protected impressing area or the area permitted for raised elements, practically without diminishing the space for applying information. FIG. 6 shows a device for producing the identification card. In FIG. 6 the cast IC module 19 and the film carrier 17 are embedded symmetrically between synthetic material films. In the laminating plates 14 there is a recess 18 partly filled with silicone to protect the thicker card area having the cast IC module 19 from increased laminating pressure.

FIGS. 6 and 7 further show a possible way of producing identification cards according to the invention having contacts situated on the surface. The contact tags 20 are directed through slots in the synthetic material films 15, 16, bent around during the laminating process and pressed into the card surface, being level with it. Whereas FIG. 6 presupposes a symmetrical construction of the carrier element and the card, FIG. 8 shows an arrangement in which the back of the card remains flat and the permitted raised area for impressed data on the front of the card is exploited to protect the IC module mechanically. The recess 18 filled with silicone is thus located only in the upper laminating plate 14. FIG. 9 again shows a symmetrical construction having the same raised areas on the front and back of the card, but the IC module is encased in a particularly thick cast 19, whereby the recesses 18 filled with silicone in the laminating plates 14 again ensure that no increased laminating pressure acts on the module. In this example the surface of the cast 19 is not laminated, so that in the area of the module the full impression height can be used to protect it with a reinforced cast or other mechanical protective arrangements.

Various modes of carrying out the invention are contemplated as being within the scope of the following claims particularly pointing out and distinctly claiming the subject matter which is regarded as the invention.

We claim:

1. A standardized data card providing accessible electrically encoded data, said card comprising:

a rectangular card member of standardized length and width, said card member comprising a stratum of generally predetermined thickness, said card having at least a first elongated zone lying generally parallel to the length of said rectangular card member, said zone being reserved for embossed indicia protruding above one side of said card to increase the overall thickness of the data card in excess of the thickness of said stratum, and a carrier element applied to said card member, said carrier element being elongated and having first and second sections displaced in the direction of elongation of said element, said first section comprising an IC module containing the electrically encoded data, said second section being flexible and thin with respect to said predetermined thickness of said card, said second section containing contact areas connected to said IC module by which the data in said module may be accessed, said first section of said carrier element being completely located in said first zone of said card member, said second section being so arranged in said card member that said contact areas are located completely outside said zone.

2. A data card as in claim 1 wherein said zone has a greater thickness obtained by increasing the elevation of the stratum on both sides of the stratum.

3. A data card as in claim 1 wherein said zone of said stratum is embossed to increase the thickness thereof.

4. A data card as in claim 1 wherein said carrier element is a generally elongate member having ends and wherein said IC module is arranged at one end of said carrier element and said contact areas are arranged at the other end.

5. A data card as in claim 1 wherein said IC module is embedded in a casting in said first section of said carrier element.

6. A data card as in claim 1 wherein said second section comprises a film containing said contact areas.

7. A data card as in claim 6 wherein said film comprises a thermostable film having high tensile strength, said contact areas and leads connecting said contact areas to said IC module being etched out of a conductive coating of said film.

8. A data card as in claim 6 wherein said film comprises a polyester film.

9. An IC module carrier element suitable for incorporation into a card member having portions of different thickness, said carrier element comprising a substrate having first and second sections, said first section comprising an IC module encased in a casting compound, said second section comprising a sheet, thinner than said cast IC module, and joined to said casting compound; said sheet containing contact areas for IC module and leads connecting said module to said contact areas.

10. An IC module as in claim 9 wherein said substrate is a generally elongate member having ends and wherein said cast IC module is arranged at one end of said substrate and said contact areas are arranged at the other end.

11. A carrier element as in claim 9 wherein said sheet comprises a thermostable film having high tensile strength, said contact areas and leads being etched out of a conductive coating of said film.

12. A carrier element as in claim 11 wherein said film is a polyester film.

* * * * *